United States Patent [19]
Bae et al.

[11] Patent Number: 5,135,883
[45] Date of Patent: Aug. 4, 1992

[54] PROCESS FOR PRODUCING A STACKED CAPACITOR OF A DRAM CELL

[75] Inventors: Dong-Joo Bae; Kyu-Hyun Chio; Won-Shik Baek, all of Seoul, Rep. of Korea

[73] Assignee: Samsung Electronics Co., Ltd., Kyounggi, Rep. of Korea

[21] Appl. No.: 582,380

[22] Filed: Sep. 14, 1990

[30] Foreign Application Priority Data

Jun. 29, 1990 [KR] Rep. of Korea ............... 1990-9725

[51] Int. Cl.⁵ .............................................. H01L 21/70
[52] U.S. Cl. ........................................ 437/52; 437/47;
    437/48; 437/60; 437/228; 437/919; 357/23.6
[58] Field of Search .................... 437/47, 52, 60, 919, 437/193, 191, 195, 228, 233, 235; 357/23.6, 51

[56] References Cited

U.S. PATENT DOCUMENTS

| | | | |
|---|---|---|---|
| 4,686,000 | 8/1987 | Heath | 156/644 |
| 4,953,126 | 8/1990 | Ema | 357/23.6 |
| 4,966,684 | 10/1990 | Pfiester | 437/195 |

FOREIGN PATENT DOCUMENTS

| | | | |
|---|---|---|---|
| 0059357 | 4/1982 | Japan | 156/644 |
| 0295709 | 12/1988 | Japan | 357/23.6 |

Primary Examiner—Tom Thomas
Attorney, Agent, or Firm—Robert E. Bushnell

[57] ABSTRACT

A stacked capacitor of the fin-like structure is provided wherein the plurality of polysilicon layers constituting the storage electrode are connected with each other in the sawtooth-like manner to overcome the structural instability of the fin-like structure. The polysilicon layers constituting the storage electrode are extended overlaying each other, so that the capacity of the capacitor in a highly integrated DRAM may be increased without increasing the area occupied by the capacitor.

14 Claims, 11 Drawing Sheets

PROCESS FOR PRODUCING A STACKED CAPACITOR OF A DRAM CELL

BACKGROUND OF THE INVENTION

The present invention relates to a semiconductor device, and particularly to a process for producing a stacked capacitor of a DRAM cell.

The semiconductor memory device tends to be highly integrated with large capacity. Particularly, since the memory capacity of a DRAM cell including a transistor and a capacitor is determined by the volume of the capacitor, as the size of the cells gets smaller and smaller, it is necessary to ensure larger and larger volume of the capacitor. A typical example of DRAM cell capacitors with a large capacity is a stacked structure, wherein the storage electrodes are stacked on the substrate, so that the expanded surface areas of the storage electrodes are used to increase the capacity of the capacitor.

Figure 1:
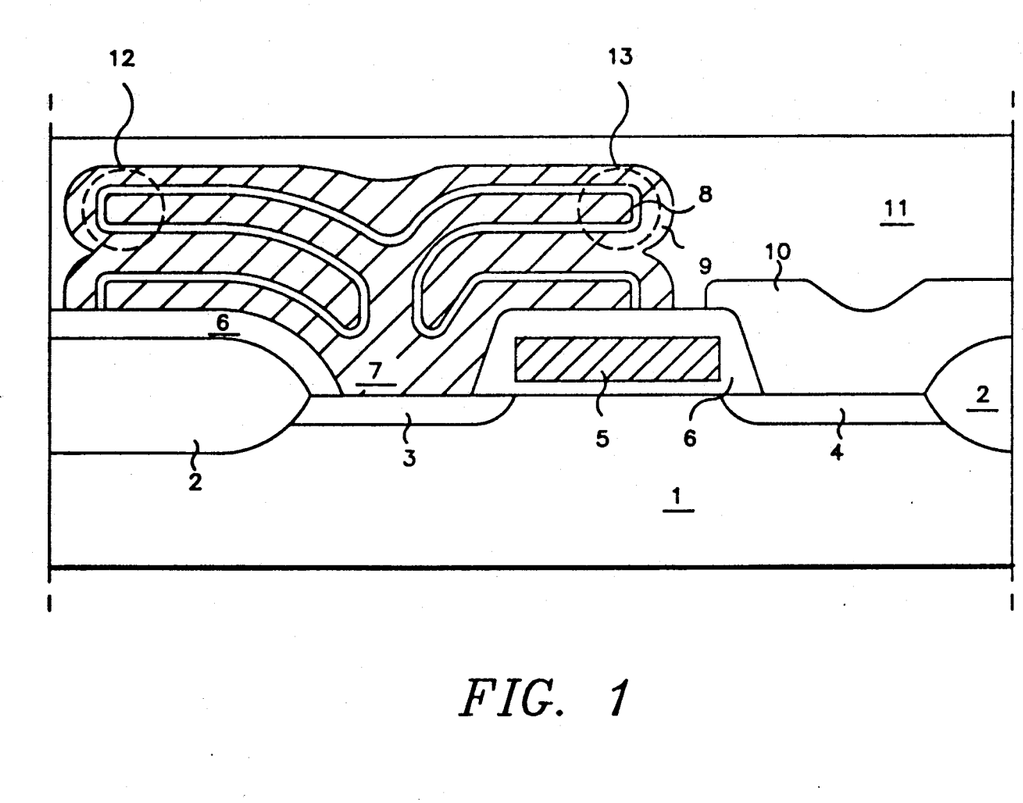
FIG. 1 illustrates a cross section of a conventional stacked capacitor.

Referring to FIG. 1 for illustrating the cross section of a conventionally improved stacked capacitor, on the substrate 1 having element isolating oxide layer 2, source and drain regions 3 and 4, word line and bit line 5 and 10, and insulating layer 6 is there formed a capacitor including fin-shaped storage electrode 7 contacting the source region 3, dielectric layer 8 and plate electrode 9. Over the whole surface of the substrate 1 is laid element protecting layer 11. The fin-shaped storage electrode 7 is formed by alternately depositing a plurality of polysilicon layers and a plurality of oxide layers on the substrate and etching them, and thereafter the whole substrate is immersed in an oxide etching solution to remove all the oxide layers remaining between the polysilicon layers. Then, dielectric layer 8 and plate electrode 9 are formed. However, in this case, the wing portions 12 and 13 of the storage electrode is susceptible to be broken when the substrate is immersed in the etching solution. Namely, if all the oxide layers between the polysilicon layers are removed, the wing portions 12 and 13 of the storage electrode 7 are suspended without any supporting layers, thus resulting in weakening of the wing portions. This drawback decreases the reliability of the process as well as causes unstable structure of a stacked capacitor formed of multiple polysilicon layers.

SUMMARY OF THE INVENTION

It is an object of the present invention to provide a process for manufacturing stacked capacitor of a stable structure having a large capacity.

According to one aspect of the present invention, a stacked capacitor includes a storage electrode of multiple polysilicon layers connected to one another in a sawtooth-like manner.

The present invention will now be described with reference to the drawings attached only by way of example.

BRIEF DESCRIPTION OF THE ATTACHED DRAWINGS

For a better understanding of the invention and to show how the same may be carried into effect, reference will now be made, by way of example, to the accompanying diagrammatic drawings, in which.

DETAILED DESCRIPTION OF PREFERRED EMBODIMENTS

Figure 2:
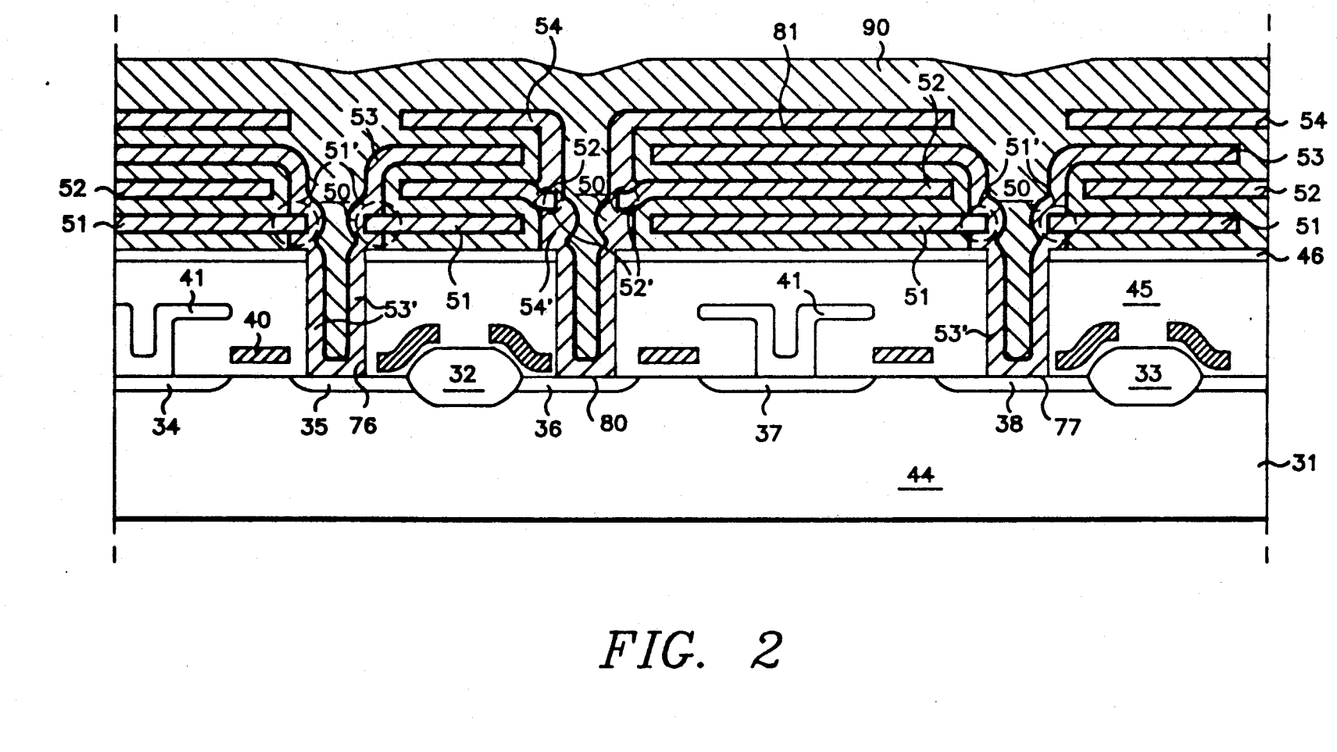
FIG. 2 illustrates a cross section of a stacked capacitor according to the present invention.

Referring to FIG. 2, on a semiconductor substrate 31 having element isolating oxide layers 32, 33, source regions 35, 36, 38 and drain regions 34, 37, word lines 40 and bit lines 41 are sequentially deposited a thick insulating interlayer 45 and a nitride layer 46. The portions of the insulating interlayer 45 and nitride layer 46 positioned over the source regions 35, 36, 38 are removed so as to form contact openings 76, 77, 80 for connecting the source regions to capacitor. The storage electrode 50 of the capacitor contacts the source regions 35, 36, 38 through the contacting openings 76, 77, 80. Over the storage electrode 50 are successively laid dielectric layer 81 and plate electrode 90. The storage electrode 50 has a fin-like structure, and the wing portions thereof respectively overlay those of the adjacent storage electrode, while two polysilicon layers including a storage electrode are engaged with each other in a sawtooth-like manner. Namely, a storage electrode contacting a source region 36 includes first polysilicon wall 54' extended vertically to the substrate with contacting the source region 36, fourth polysilicon layer 54 extended parallel to the substrate with contacting the upper end of the first polysilicon wall 54', and second polysilicon layer 52 extended parallel to the substrate with contacting the intermediate portion of the first polysilicon wall 54'. Here, it will be noted that one end portion 52' of the second polysilicon layer 52 is engaged with the first polysilicon wall 54' in a sawtooth-like manner. Similarly, the storage electrode connected to the source region 38 includes second polysilicon wall 53' extended vertically to the substrate with contacting the source region 38, third polysilicon layer 53 extended parallel to the substrate with contacting the upper end of the second second polysilicon layer 53', and first polysilicon layer 51 extended parallel to the substrate with contacting the second polysilicon wall 53' at the lower portion of the second polysilicon 52. Of course, one end portion 51' of the first polysilicon layer 51 is engaged with the second polysilicon wall 53' in a sawtooth-like manner. Such connections between the polysilicon layers compensate for the structural weakness of the fin-like structure of the storage electrode.

Hereinafter, the inventive process for producing a stacked capacitor will be specifically described with reference to FIGS. 3A-3J.

Figure 3A:
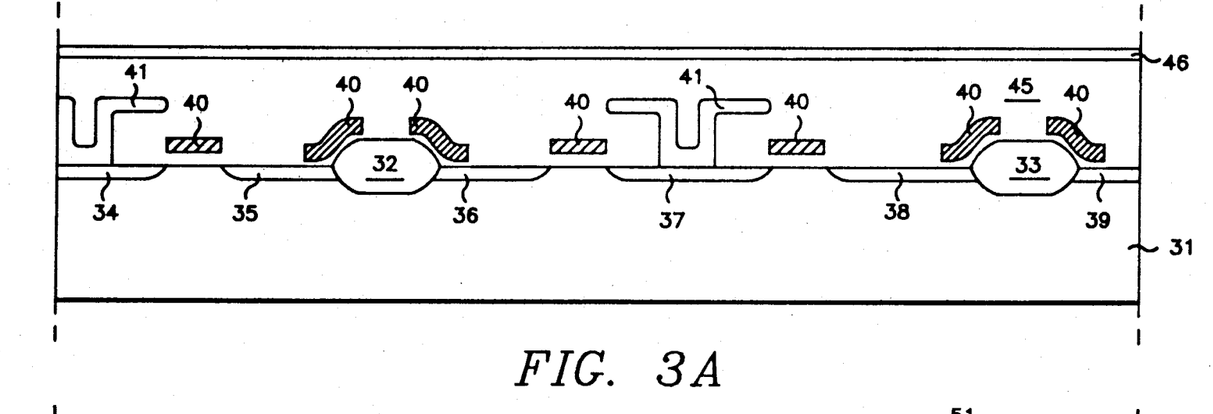
FIGS. 3A to 3J illustrate the steps of the inventive process.

Referring to FIG. 3A, on the semiconductor substrate 31 are formed element isolating oxide layers 32, 33, source regions 35, 36, 38, 39, drain regions 34, 37, word line 40 and bit line 41, over which are successively laid insulating interlayer 45, and nitride layer 46 of which thickness is 1,000–2,000 Å. The nitride layer 46 serves as an etching preventive layer in a subsequent processing step. For descriptive convenience, the source regions 36 and 39 are referred to as first source region, and the source regions 35 and 38 as second source region.

Figure 3B:
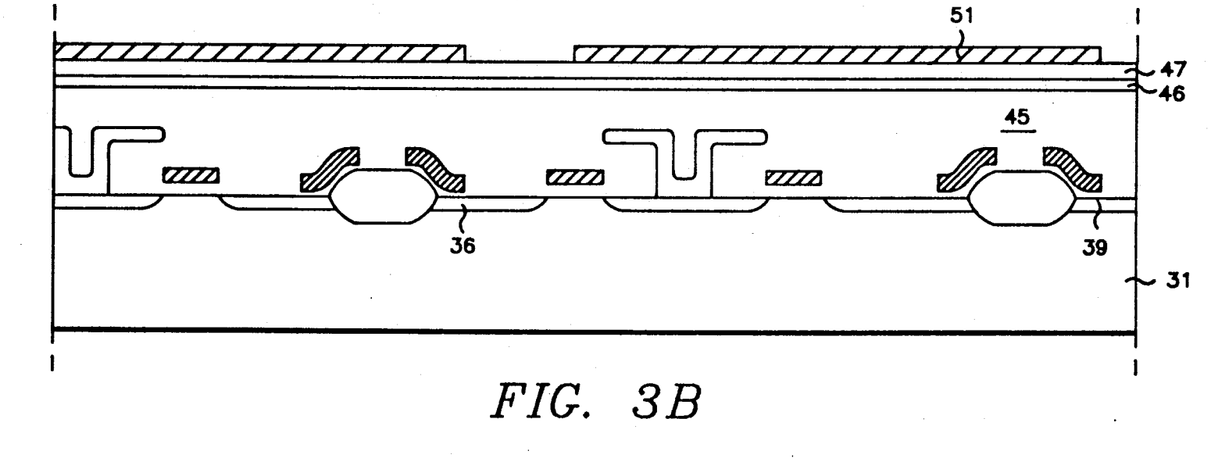

In the step of FIG. 3B, first oxide layer 47 of 1,000–4,000 Å is formed on the nitride layer 46. Then, the first oxide layer 47 is covered by first polysilicon layer 51 500–3,000 Å, and the portions of the polysilicon layer 51 positioned above the first source regions 36, 39 are selectively etched. The oxide layers and polysilicon layers formed thereafter are covered with the same thickness to those of the first oxide layer 47 and the first polysilicon layer 51, respectively.

Figure 3C:
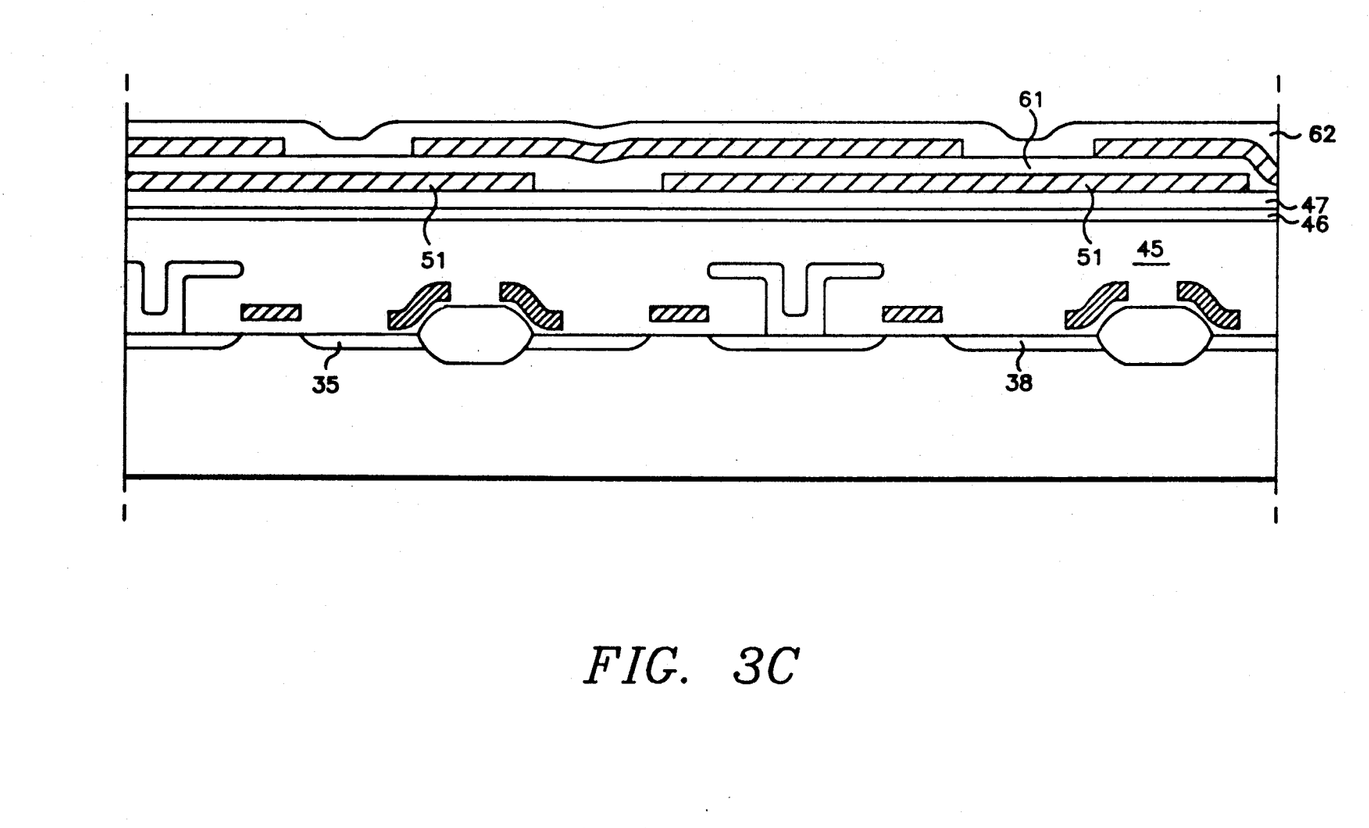

Referring to FIG. 3C, second oxide layer 61 is formed on the exposed surface of the first oxide layer 47 and the first polysilicon layer 51. The second oxide layer 61 is covered by second polysilicon layer 52, and the portions of the second polysilicon layer 52 positioned above the second source regions 35, 38 are selectively etched.

Figure 3D:
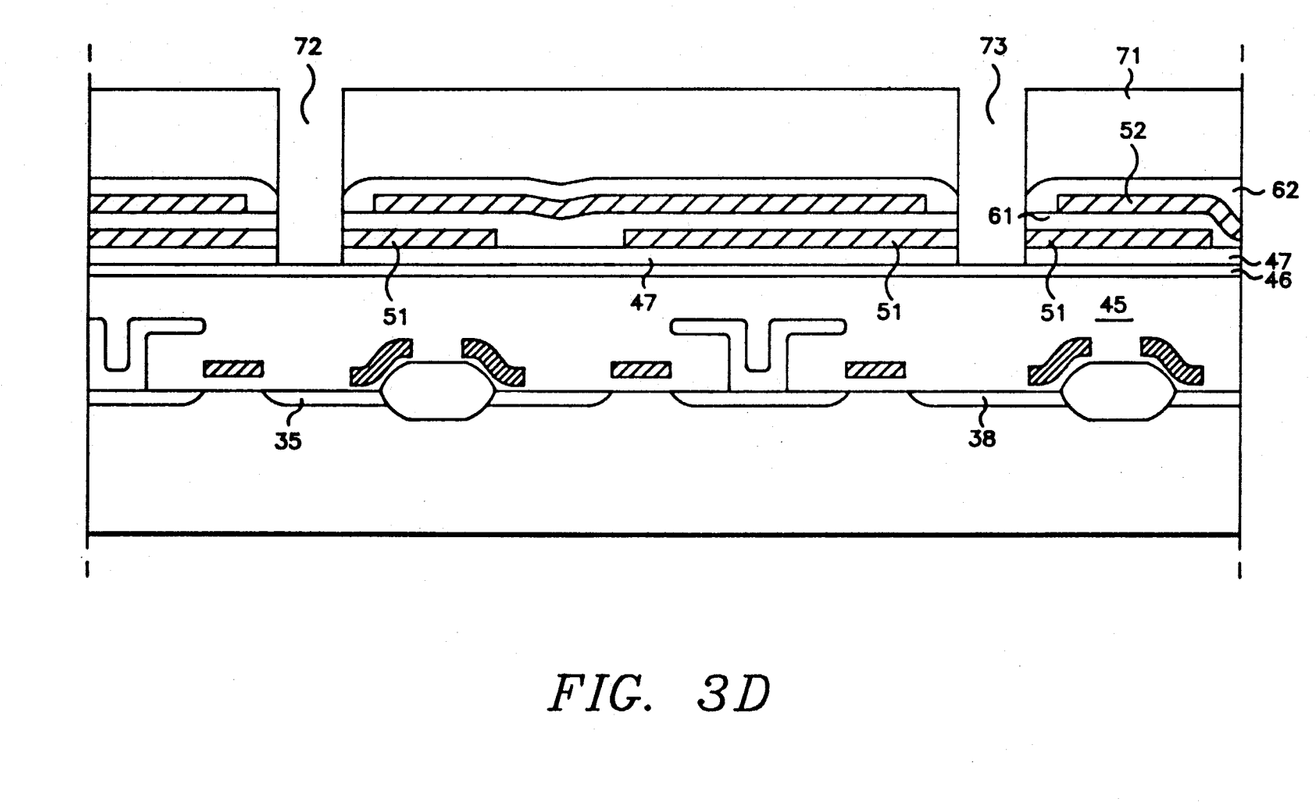

Referring to FIG. 3D, after sequentially forming third oxide layer 62 and first photoresist pattern 71 on the exposed surface of the second oxide layer 61 and the second polysilicon layer 52, the portions of third oxide layer 62, second oxide layer 61, first polysilicon layer 51, and first oxide layer 47 positioned above the second source regions 35, 38 are sequentially etched to form first openings 72, 73 exposing a portion of the surface of the nitride layer 46.

Figure 3E:
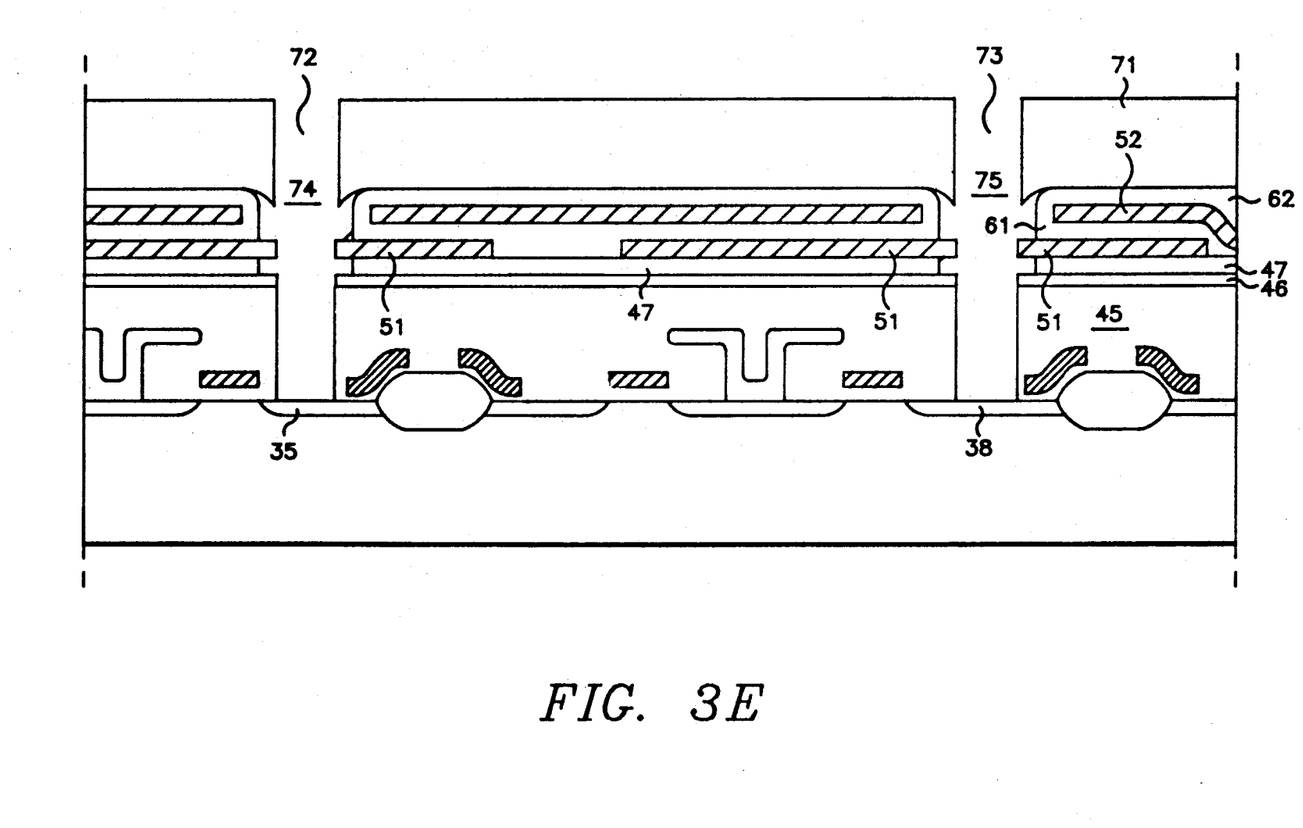

Referring to FIG. 3E, the semiconductor substrate 31 is immersed into the oxide etching solution of BOE (Buffered Oxide Etch) consisting of NH4F and HF in the ratio of 7 to 1 for 5 to 15 seconds, or into the HF solution with the ratio of H20 to HF being 100 to 1 for 1 to 6 minutes with the photoresist pattern 71 unremoved, so that the end portion 51' of the first polysilicon layer 51 is exposed because only the side walls of the first, second and third oxide layers 47, 61 and 62 exposed to the first openings 72 and 73 are partially etched laterally with the first polysilicon layer 51 unchanged, thereby forming expanded second openings 74 and 75. In this case, the isolation distance between the second openings 74, 75 and the second polysilicon layer 52 is 500–1,000 Å. The BOE solution consists of HF with an amount of the additional NH4F to buffer the strong etching property of HF. Further, it will be easily appreciated by a person having the ordinary knowledge in this technical field that the etching speed may be adjusted by adding water to the HF.

Figure 3F:
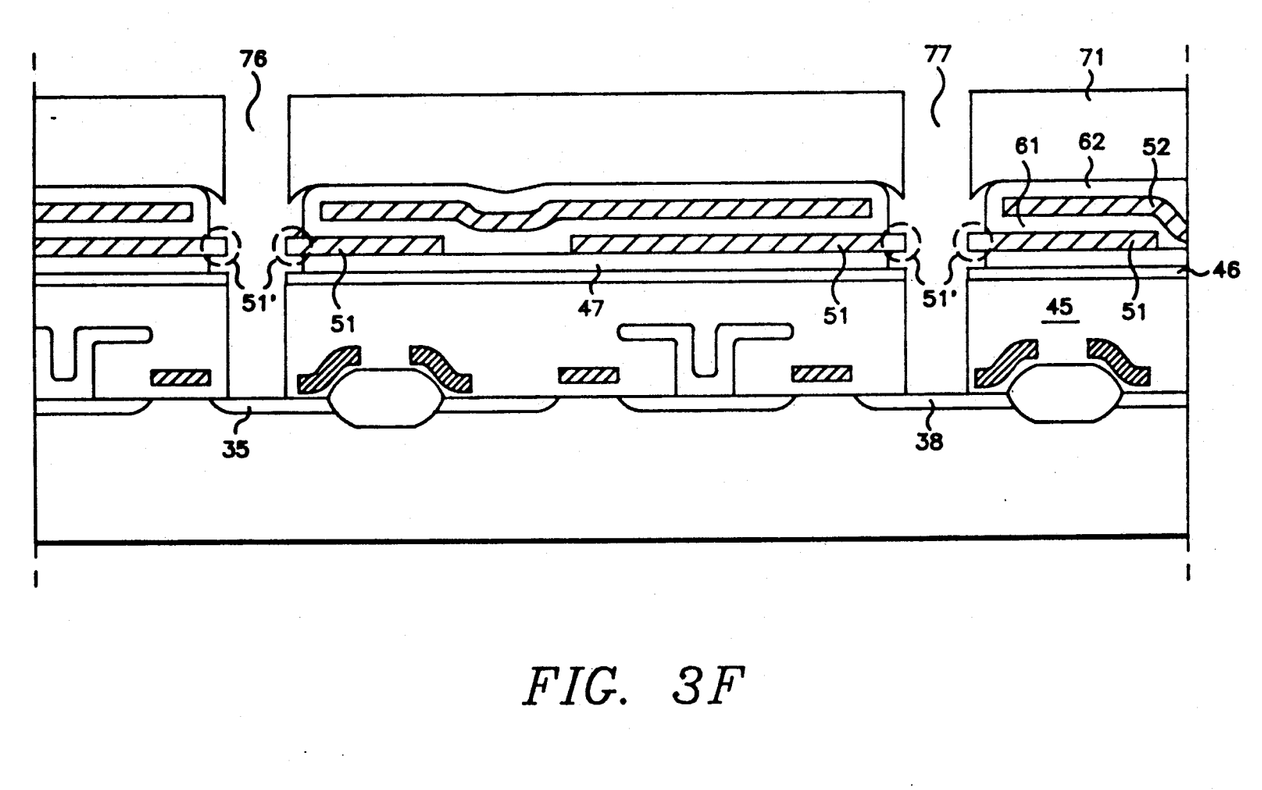

In the step of FIG. 3F, the exposed nitride layer 46 and the insulating interlayer 45 are sequentially etched through the first photoresist pattern 71 as etching mask so as to form first contact opening 76, 77 exposing the surfaces of the second conductive regions 35, 38. Thereafter, the first photoresist pattern 71 is removed.

Figure 3G:
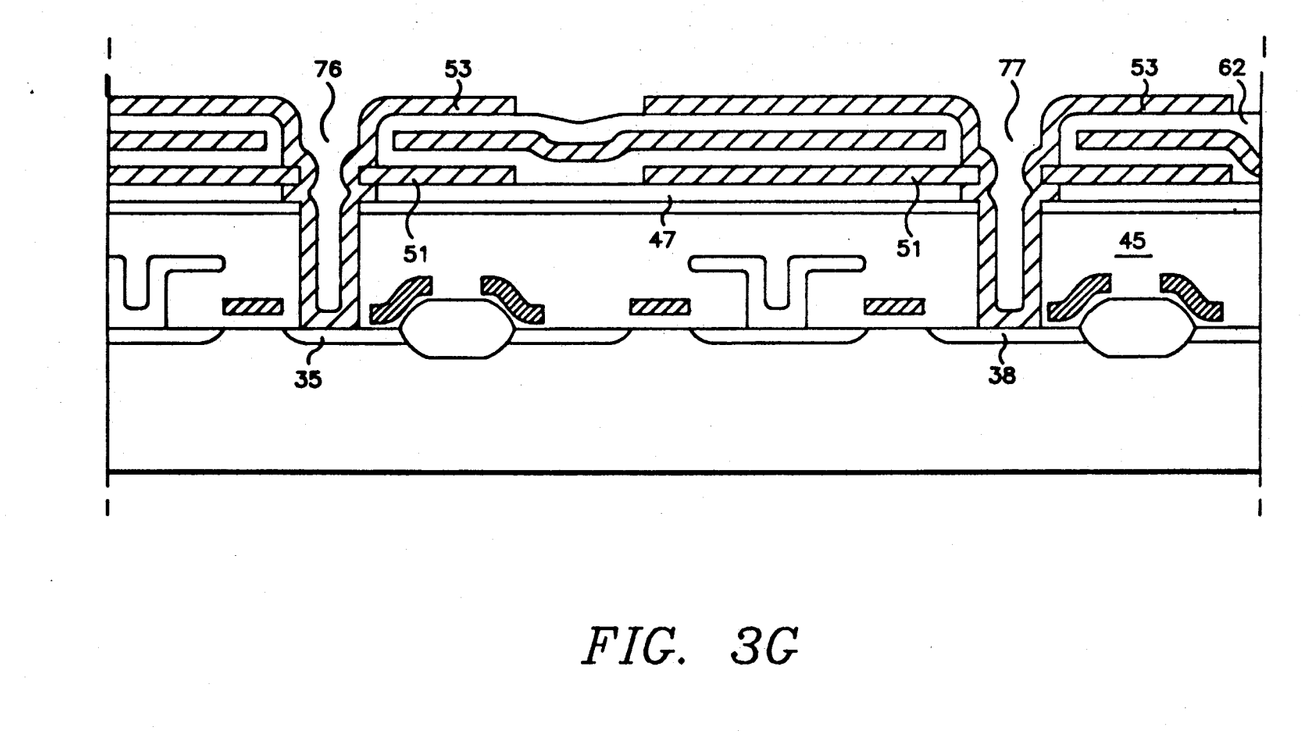

In the step of FIG. 3G, after third polysilicon layer 53 is deposited on the insides of the first contact openings 76, 77 and the upper surface of the third oxide layer 62, the portions of the third polysilicon layer 53 positioned above the second conductive source regions 35, 38 are selectively etched. In this case, the one end portion 51' of the first polysilicon layer 51 projected laterally in the first contact openings 76, 77 is surrounded by the third polysilicon layer 53. Thus, a storage electrode connected to the second source region 35, 38 is accomplished.

Figure 3H:
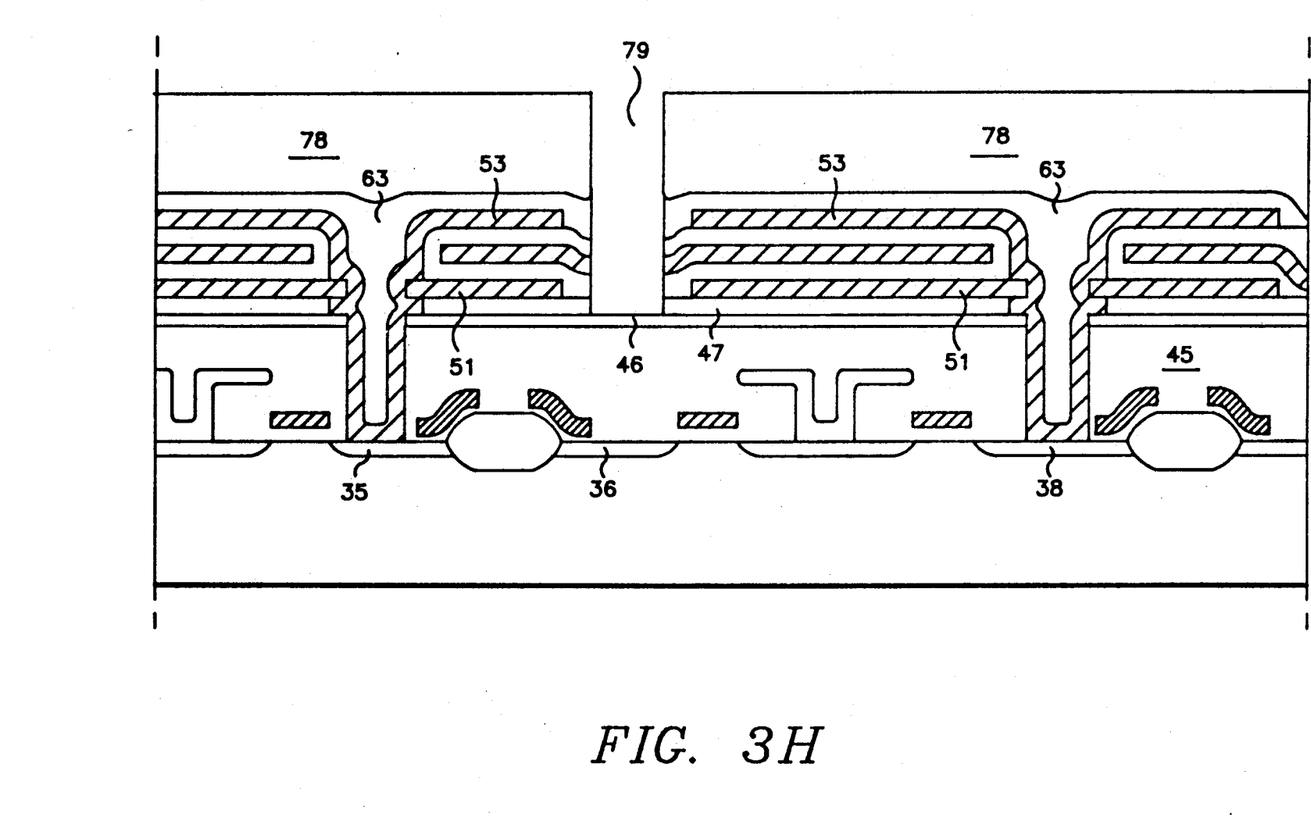

In the step of FIG. 3H, after sequentially forming fourth oxide layer 63 and second photoresist pattern 78 on the exposed surface of the third oxide layer 62 and the third polysilicon layer 53, the portions of the fourth oxide layer 63, third oxide layer 62, second polysilicon layer 52, second oxide layer 61, and first oxide layer 47 positioned over the first conductive region 36 are sequentially etched to form third opening 79 exposing a portion of the surface of the nitride layer 46.

Figure 3I:
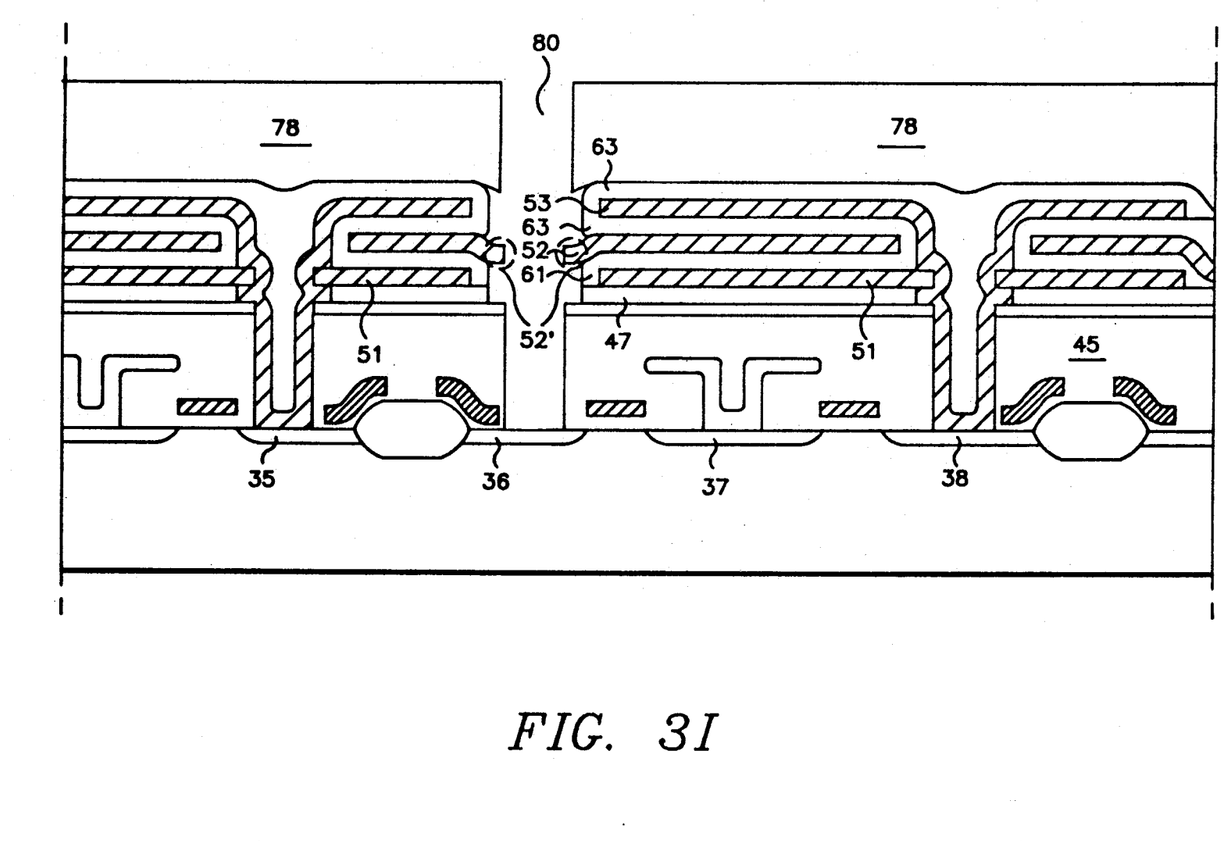

Referring to FIG. 3I, the semiconductor substrate 31 is immersed into the oxide etching solution of BOE (Buffered Oxide Etch) consisting of NH4 F and HF in the ratio of 7 to 1 for 5 to 15 seconds, or into the HF solution with the ratio of H20 to HF being 100 to 1 for 1 to 6 minutes with the photoresist pattern 78 unremoved, so that the end portion 52' of the second polysilicon layer 52 is exposed because only the side walls of the first, second, third and fourth oxide layers 47, 61, 62 and 63 exposed to the third opening 79 are partially etched laterally with the first polysilicon layer 52 unchanged, thereby forming expanded opening. This is the case similar to the second openings 74, 75 obtained by laterally etching the side walls of the first openings 72, 73. In this case, the isolation distance between the third opening 79, and the first and third polysilicon layers 51, 53 is 500–1,000 Å.

Thereafter, the exposed nitride layer 47 and the insulating interlayer 46 are sequentially etched through the photoresist pattern 78 as etching mask so as to form second contact opening 80 exposing the surface of the first source region 36, thereafter the above second photoresist pattern 78 being removed.

Figure 3J:
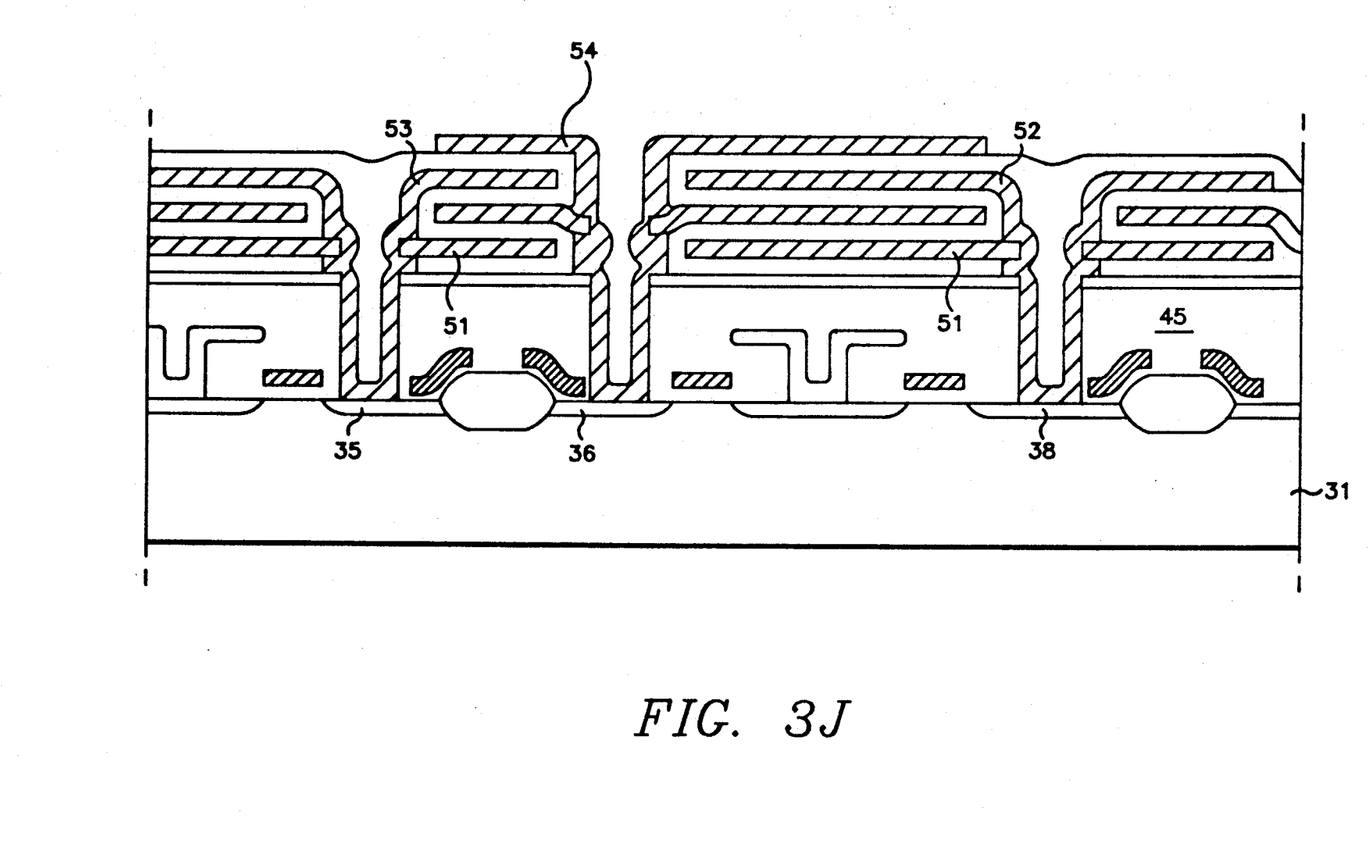

In the step of FIG. 3J, after depositing fourth polysilicon layer 54 on the inside of the second contact opening 80 and the upper surface of the fourth oxide layer 63, the portions of the fourth polysilicon layer 54 positioned above the first source regions 36, 39 are selectively etched. In this case, the one end portion 52' of the second polysilicon layer 52 projected in the second contact opening 80 is surrounded by the fourth polysilicon layer 54. Thus, another storage electrode connected to the first source region 36 is obtained. Thereafter, the whole substrate is immersed into an oxide etching solution such as hydrogen fluoride in order to remove the remaining oxide layers. Meanwhile, the first polysilicon layer 51 is connected with the third polysilicon layer 53 in a sawtooth-like manner by means of the projected end portion 51' thereof, while the second polysilicon layer 52 is connected with the fourth polysilicon layer 54 in a sawtooth-like manner by means of the projected end portion 52' thereof, so that the wing portions of the fin-shaped structure are not susceptible to be broken even in the oxide etching solution. After removing the remaining oxide layers, the exposed surfaces of the polysilicon layers are thermally oxidized or an ONO (Oxide-Nitride-Oxide) film is formed to form the dielectric layer 81 of 30–50 Å thick, and the fifth polysilicon layer 90 is deposited on the whole surface of the substrate to form the plate electrode 90, thus accomplishing the stacked capacitor as shown in FIG. 2.

Although the storage electrode includes two polysilicon layers in the above described embodiment, more layers are employed provided the process reliability is maintained.

According to the present invention, a plurality of polysilicon layers constituting the storage electrode are cross-coupled with each other, so that the inventive process may be sufficiently applied to a very large integrated memory device with the capacity of more than 256MB.

As described above, the present invention provides a stacked capacitor of the fin-like structure, wherein the plurality of polysilicon layers constituting the storage electrode are connected with each other in the sawtooth-like manner to overcome the structural instability of the fin-like structure. Moreover, the polysilicon layers constituting the storage electrode are extended overlaying each other, so that the capacity of the capacitor in a highly integrated DRAM may be increased without increasing the area occupied by the capacitor.

Therefore, the present invention provides a process for producing the capacitor of a DRAM having a large capacity without processing inadequacy.

Although specific constructions and procedures of the invention have been illustrated and described herein, it is not intended that the invention be limited to the elements and constructions disclosed. One skilled in the art will easily recognize that the particular elements or subconstructions may be used without departing from the scope and spirit of the invention.

What is claimed is:

1. A process for producing a semiconductor device comprising:
   a first step of sequentially depositing an insulating interlayer and a nitride layer on a semiconductor substrate including element isolating oxide layers, first and second conductive regions, word lines and bit lines;
   a second step of forming a first oxide layer on said nitride layer, said first oxide layer being covered by a first polysilicon layer, and etching a portion of said first polysilicon layer, said portion being positioned above said first conductive region;
   a third step of forming a second oxide layer on a surface of said first oxide layer and said first polysilicon layer, said surface of said first oxide layer being exposed by said etching of said portion of said first polysilicon layer, said second oxide layer being covered by a second polysilicon layer, and etching a portion of said second polysilicon layer which is positioned above said second conductive region to expose a surface portion of said second oxide layer;
   a fourth step of sequentially forming a third oxide layer and a first photoresist pattern on the exposed surface portion of said second oxide layer and said second polysilicon layer, sequentially etching portions of said third oxide layer, said second oxide layer, said first polysilicon layer, and said first oxide layer which are positioned above said second conductive region to form a first opening exposing a portion of a surface of said nitride layer;
   a fifth step of immersing said semiconductor substrate into an oxide etching solution for a predetermined time period with said photoresist pattern unremoved so as to expose one end portion of said first polysilicon layer;
   a sixth step of sequentially etching said exposed portion of said nitride layer and said insulating interlayer through said first photoresist pattern used as an etching mask so as to form a first contact opening by exposing a surface of said second conductive region, and thereafter, removing said first photoresist pattern;
   a seventh step of depositing a third polysilicon layer inside of said first opening and inside said first contact opening and on an upper surface of said third oxide layer, and etching a portion of said third polysilicon layer which is positioned above said second conductive region to expose a surface portion of said third oxide layer;
   an eighth step of sequentially forming a fourth oxide layer and a second photoresist pattern on the exposed surface portion of said third oxide layer and said third polysilicon layer, sequentially etching portions of said fourth oxide layer, said third oxide layer, sid second polysilicon layer, said second oxide layer, and said first oxide layer which are positioned over said first conductive region to form a second opening exposing another portion of the surface of said nitride layer;
   a ninth step of immersing said semiconductor substrate into an oxide etching solution for another predetermined time period with said second photoresist pattern unremoved so as to expose one end portion of said second polysilicon layer;
   a tenth step of sequentially etching said exposed another portion of the surface of said nitride layer and said insulating layer through sid second photoresist pattern used as an etching mask so as to form a second contact opening by exposing a surface of the first conductive region, and thereafter, removing said second photoresist pattern; and
   an eleventh step of depositing a fourth polysilicon layer inside of said second opening and said second contact opening and on an upper surface of said fourth oxide layer, and etching a portion of said fourth polysilicon layer which is positioned above said first conductive region.

2. A process for producing a semiconductor device as claimed in claim 1, wherein said third polysilicon layer is connected to said first polysilicon layer in the fifth step.

3. A process for producing a semiconductor device as claimed in claim 1, wherein said one end portion of said first polysilicon layer is surrounded by said third polysilicon layer.

4. A process for processing a semiconductor device as claimed in claim 1, wherein said fourth polysilicon layer is connected to said second polysilicon layer.

5. A process for producing a semiconductor device as claimed in claim 1, wherein said one end portion of the second polysilicon layer is surrounded by said fourth polysilicon layer.

6. A process for producing a semiconductor device as claimed in claim 1, wherein said oxide etching solution is a buffered oxide etch solution and said predetermined time period is 5 to 15 seconds in said fifth step and said oxide etching solution is a hydrogen fluoride solution and said another predetermined time period is 1 to 6 minutes in said ninth step.

7. A process for producing a semiconductor device as claimed in claim 1, wherein said nitride layer serves as an etching preventive layer in said fifth and ninth steps.

8. A process for producing a semiconductor device as claimed in claim 1, wherein sid first, second, third and fourth oxide layers insulate said second and fourth polysilicon layers from said first and second polysilicon layers.

9. A process for producing a semiconductor device as claimed in claim 1, further comprising:
   a twelfth step of forming a thin dielectric layer over an exposed surface of said nitride layer; and
   a thirteenth step of forming a fifth polysilicon layer over said semiconductor substrate including a surface of said dielectric layer;
   whereby said first to fourth polysilicon layers constitute storage electrodes of stacked capacitors and said fifth polysilicon layer is a plate electrode thereof.

10. A process for producing a semiconductor device as claimed in claim 1, further comprised of repeating said fourth to ninth steps.

11. A process for producing a stacked capacitor of a DRAM cell including a semiconductor substrate, conductive regions formed in said substrate, an insulating interlayer formed on said conductive regions and an etching preventative layer formed on said insulating layer, comprising:

a first step of sequentially forming a first oxide layer, a first polysilicon layer and a second oxide layer over said etching preventative layer;

a second step of forming a photoresist pattern on said second oxide layer, etching portions of said first polysilicon layer, said first oxide layer and said second oxide layer so as to form an opening to a portion of a surface of said etching preventative layer;

a third step of immersing said semiconductor substrate into an oxide etching solution for a given time period with said photoresist pattern unremoved, thus exposing one end portion of said first polysilicon layer;

a fourth step of sequentially etching portions of said etching preventative layer and said insulating layer exposed through said opening through said photoresist pattern used as a mask, so as to form a contact opening to an exposed portion of a surface of said conductive region;

a fifth step of depositing a second polysilicon layer inside of said opening and said contact opening and on said second oxide layer;

a sixth step of removing remaining portions of said first and second oxide layers;

a seventh step of forming a dielectric layer on exposed surfaces of said first and second polysilicon layers; and an eighth step of depositing a third polysilicon layer over an upper region of said semiconductor substrate and over a surface of said dielectric layer.

12. A process for producing a stacked capacitor of a DRAM cell as claimed in claim 11 wherein said second polysilicon layer is connected to said first polysilicon layer in said fifth step.

13. A process for producing a stacked capacitor of a DRAM cell as claimed in claim 11 wherein said one end portion of the first polysilicon layer is surrounded by said second polysilicon layer.

14. A process for producing a stacked capacitor of a DRAM cell as claimed in claim 11, wherein said oxide etching solution is a buffered oxide etch solution and said given time period is 5 to 15 seconds or said oxide etching solution is a hydrogen fluoride solution and said another given time period is 1 to 6 minutes, in said third step.

* * * * *

UNITED STATES PATENT AND TRADEMARK OFFICE
CERTIFICATE OF CORRECTION

PATENT NO.  : 5,135,883

DATED       : 4 August 1992

INVENTOR(S) : Dong-Joo BAE, Kyu-Hyun CHOI and Won-Shik BAEK

It is certified that error appears in the above-identified patent and that said Letters Patent is hereby corrected as shown below:

Column 6, Line 1,  change "sid" to --said--; and
    Column 6, Line 13, change "sid" to --said--.

Signed and Sealed this

Tenth Day of August, 1993

Attest:

MICHAEL K. KIRK

Attesting Officer

Acting Commissioner of Patents and Trademarks